United States Patent
Tavakkoli Kermani Ghariehali

(10) Patent No.: US 12,085,852 B2
(45) Date of Patent: Sep. 10, 2024

(54) TEMPLATE, METHOD OF FORMING A TEMPLATE, APPARATUS AND METHOD OF MANUFACTURING AN ARTICLE

(71) Applicant: CANON KABUSHIKI KAISHA, Tokyo (JP)

(72) Inventor: Amir Tavakkoli Kermani Ghariehali, Albany, NY (US)

(73) Assignee: Canon Kabushiki Kaisha, Tokyo (JP)

( * ) Notice: Subject to any disclaimer, the term of this patent is extended or adjusted under 35 U.S.C. 154(b) by 242 days.

(21) Appl. No.: 17/562,863

(22) Filed: Dec. 27, 2021

(65) Prior Publication Data
US 2023/0205080 A1    Jun. 29, 2023

(51) Int. Cl.
| | |
|---|---|
| *H01L 21/02* | (2006.01) |
| *B29C 59/02* | (2006.01) |
| *G03F 1/42* | (2012.01) |
| *G03F 7/00* | (2006.01) |
| *H01L 21/30* | (2006.01) |
| *H01L 21/027* | (2006.01) |

(52) U.S. Cl.
CPC ............ *G03F 7/0002* (2013.01); *B29C 59/02* (2013.01); *G03F 1/42* (2013.01); *H01L 21/30* (2013.01); *H01L 21/0271* (2013.01)

(58) Field of Classification Search
CPC ................................ H01L 21/30; B29C 59/02
See application file for complete search history.

(56) References Cited

U.S. PATENT DOCUMENTS

| | | | |
|---|---|---|---|
| 6,936,194 B2 | 8/2005 | Watts | |
| 8,066,930 B2 | 11/2011 | Sreenivasan | |
| 8,349,241 B2 | 1/2013 | Sreenivasan | |
| 2009/0250840 A1* | 10/2009 | Selinidis | G03F 9/7076 264/293 |
| 2010/0109194 A1 | 5/2010 | Miller et al. | |
| 2010/0255411 A1* | 10/2010 | Sato | G03F 7/0002 430/5 |
| 2013/0105441 A1* | 5/2013 | Nozawa | G03F 7/0015 156/345.3 |
| 2018/0136556 A1 | 5/2018 | Choi et al. | |

(Continued)

FOREIGN PATENT DOCUMENTS

| | | |
|---|---|---|
| JP | 2010094845 A | 4/2010 |
| JP | 2010527137 A * | 8/2010 |

(Continued)

*Primary Examiner* — Martin J Angebranndt
(74) *Attorney, Agent, or Firm* — Canon U.S.A., Inc. I.P. Division

(57) ABSTRACT

A method of forming an imprint template. A hard mask layer is formed at a first side first side of a template plate. An imprint lithography is performed to form a patterned hard mask covering the first region, the patterned hard mask having a pattern portion and an edge portion defined in the same imprint lithography. The template plate is dry etched with the first region of the template plate covered with the patterned hard mask. An additional mask layer is formed on the patterned hard mask. A wet etch process is performed with both the patterned hard mask and the additional mask layer formed on the template plate to form a mesa under the pattern portion with the edge portion of the hard mask overhanging on the second region of the template plate.

12 Claims, 15 Drawing Sheets

(56) References Cited

U.S. PATENT DOCUMENTS

2018/0169910 A1    6/2018  Choi
2019/0086798 A1*   3/2019  Nagai ................. B29C 33/3842

FOREIGN PATENT DOCUMENTS

| JP | 2011029248 A | * | 2/2011 |
| JP | 2014008631 A | * | 1/2014 |
| JP | 2014138154 A | * | 7/2014 |
| JP | 5983218 B2 | * | 8/2016 |
| JP | 6028413 B2 | | 11/2016 |
| JP | 6102519 B2 | * | 3/2017 |
| JP | 2018147915 A | * | 9/2018 |
| JP | 2019024030 A | * | 2/2019 |
| JP | 2019087678 A | * | 6/2019 |
| JP | 2019114667 A | | 7/2019 |
| JP | 2020113563 A | * | 7/2020 |

* cited by examiner

TEMPLATE, METHOD OF FORMING A TEMPLATE, APPARATUS AND METHOD OF MANUFACTURING AN ARTICLE

BACKGROUND

Field of Art

The present disclosure relates to nanoimprint lithography template, method of forming a nanoimprint lithography template, method of manufacturing an article with a nanoimprint lithography template, and more particularly, to nanoimprint lithography processing in semiconductor fabrication.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate; therefore, nano-fabrication becomes increasingly important. Nano-fabrication provides for greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating one or more layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into and/or onto an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, formable material removal, dicing, bonding, packaging, and the like.

SUMMARY

A method of forming an imprint template is provided. A template plate having a first side and a second side opposite to the first side is provided. The first side having a first region and a second region surrounding the first region. A hard mask layer is formed on the first side of the template plate. An imprint lithography process is performed on the hard mask layer to form a first mask used to form a patterned hard mask covering the first region of the template plate. The patterned hard mask may include a pattern portion and an edge portion defined in the same imprint lithography. The template is drying etched with the first region of the template plate covered with the patterned hard mask. An additional mask layer is formed on the patterned hard mask. The template plate is wet etched with both the patterned hard mask and the additional mask layer formed thereon to form a mesa under the pattern portion with the edge portion of the hard mask overhanging on the second region of the template plate.

The template plate may be a glass plate, and the hard mask layer may be a Cr layer. A core-out portion may be formed at the second side and aligned with the first region. The imprint lithography may include applying an imprint resist layer on the hard mask layer over the first region of the template plate; contacting a master template with the imprint resist layer to transfer a pattern to the imprint resist layer; curing the imprint resist layer; and removing the master template from the cured imprint resist layer.

Prior to dry etching the template plate, the method may further comprises forming a positive photoresist layer to cover the first side of the template plate; exposing the photoresist layer formed over the first region with light incident from the second side while shielding the photoresist layer formed over the second region from being exposed by the light; and developing the positive photoresist layer to form the additional mask covering the patterned hard mask, the additional mask including a central portion and a periphery thinner than the central portion. The additional mask layer may be removed after wet etching the template plate and prior to dry etching the template plate.

The additional mask layer may include another hard mask layer, and the method may further include the following steps. A negative photoresist layer is formed to cover the first side of the template plate. The photoresist layer formed over the first region is exposed with light incident from the second side while shielding the photoresist layer formed over the second region from being exposed by the light. The negative photoresist layer is developed to form a photoresist mask having an outer portion covering the second region of the template plate and an inner portion covering a periphery of the edge portion of the patterned hard mask. A part of the outer portion thicker than the inner portion of the photoresist mask is removed while performing dry etching on the template plate. An additional hard mask layer is formed to cover the remaining photoresist mask and the patterned hard mask; forming an additional photoresist layer on the additional hard mask layer. The additional photoresist layer is planarized until the additional hard mask covering the remaining photoresist mask is removed and the additional mask is formed. The patterned hard mask and the additional hard mask are removed after wet etching the template plate to form the mesa under the pattern portion with the edge portion overhanging on second region of the template plate. A marking made be formed in the second region of the template plate before forming the patterned hard mask.

The additional mask layer may include another hard mask layer, and the method may further include the following steps. A marking may be formed in the second region of the template plate before forming the patterned hard mask. A first photoresist layer may be formed after dry etching the template plate with the patterned hard mask formed on the template plate. The photoresist layer may be exposed with light from the first side of the template plate. A second photoresist layer may be formed on the first photoresist layer. The first photoresist layer and the second photoresist layer may be exposed with light incident from the second side of the template plate. The second photoresist layer is developed to form a photoresist mask, the photoresist mask includes a thicker outer portion covering a part of the first photoresist layer on the second region of the template plate and a thinner portion covering a part of the first photoresist layer on a periphery of the edge portion of the patterned hard mask. The developed second photoresist layer. Another hard mask layer is formed, and a third photoresist layer is formed. The third photoresist layer is planarized until the another hard mask layer over the second region of the template plate is removed. The first photoresist layer is removed. The patterned hard mask and the additional hard mask are removed after wet etching the template plate to form the mesa under the pattern portion with the edge portion overhanging on second region of the template plate.

In one embodiment, the edge portion of the patterned hard mask has a width of about 30 μm. An edge of the mesa formed by wet etching is defined by an edge feature in the patterned hard mask that is formed with an imprint lithography template that is also used to define pattern features using dry etching in the first region of the template. A core-out portion may be formed at the second side, the core-out portion being aligned with the first region, prior to performing imprint lithography on top of the hard mask.

An imprint template having a first surface and a second surface at two opposite sides thereof is provided. The imprint template includes a core-out portion recessed from second surface at a first region of imprint template, the first region being surrounded by a second region of the template; a mesa formed on the first surface at the first region, wherein the mesa includes: a top with a pattern formed thereon, and a bottom larger than the top. A difference between the top and the bottom being determined in a same imprint lithography process for defining the pattern.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
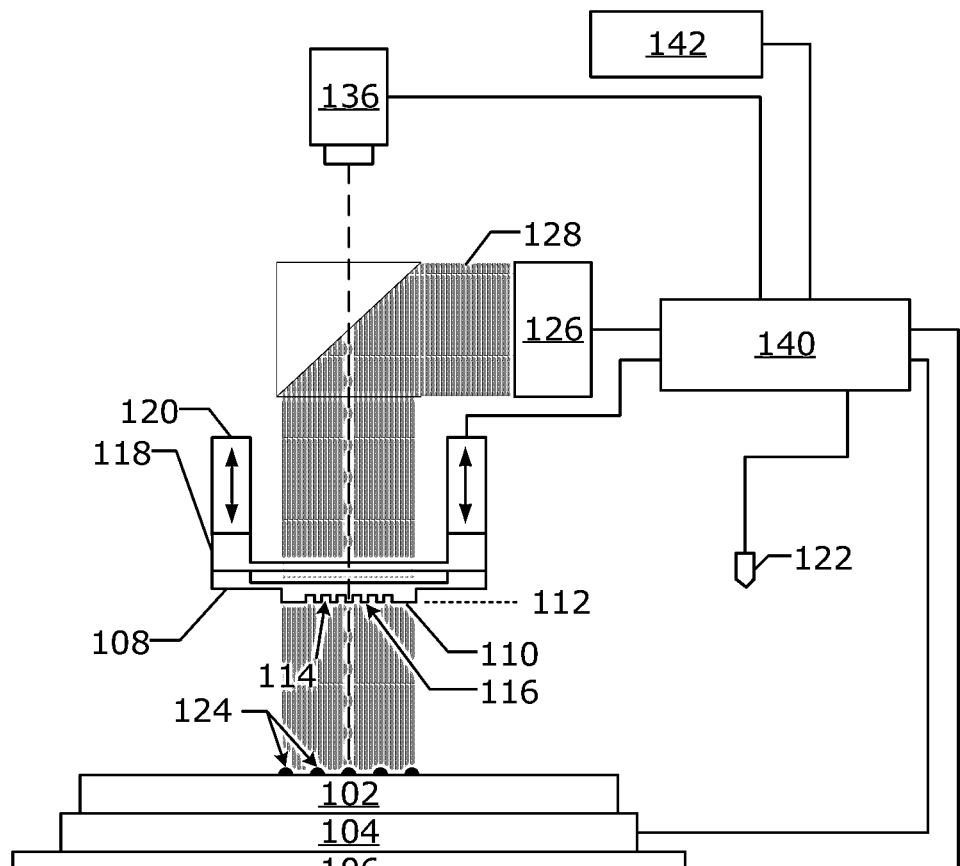
FIG. 1 is a diagram illustrating a nanoimprint lithography system.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates a system for nanoimprint lithography. The nanoimprint lithography system 100 is used to form a relief pattern a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is template 108 having a working surface 112 facing substrate 102. Template 108 may include a body having a first side and a second side with one side having a mesa 110 (also referred to as mold 110) extending therefrom towards substrate 102. Mesa 110 may have a working surface 112 thereon. Alternatively, template 108 may be formed without mesa 110. Template 108 may be formed from materials including, but not limited to, fused silica, quartz, silicon, organic polymers, siloxane polymers, borosilicate glass, fluorocarbon polymers, metal, hardened sapphire, and/or the like. In an embodiment the substrate is readily transparent to UV light. Surface 112 may be the same areal size as the surface of the substrate 108. Surface 112 may be smaller than the surface of the substrate and may be used in a step in repeat manner to pattern the surface of the substrate. The working surface 112 comprises features defined by a plurality of spaced-apart recesses 114 and protrusions 116, though embodiments of the present invention are not limited to such configurations. The working surface 112 may also be a featureless surface which may be used for forming a planarized surface.

The template 108 may be coupled to or retained by a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include a system such as a zone based vacuum chuck, an actuator array, a pressure bladder, etc., which can apply a pressure differential to a back surface of the template 108 to cause the template to bend and deform. In one embodiment, the template chuck 118 includes a zone based vacuum chuck which can apply a pressure differential to a back surface of the template, causing the template to bend and deformed as further detailed herein.

The template chuck 118 may be coupled to an imprint head 120 which is a part of the positioning system. The imprint head 120 may be movably coupled to a bridge. The imprint head 120 may include one or more actuators such as voice coil motors, piezoelectric motors, linear motor, nut and screw motor, etc., which are configured to move the template chuck 118 relative to the substrate 102 in at least the z-axis direction, and potentially other directions (e.g. x-, y-, θ-, ψ-, and φ-axis).

The nanoimprint lithography system 100 may further comprise a fluid dispenser 122. The fluid dispenser 122 may also be movably coupled to the bridge. In an embodiment, the fluid dispenser 122 and the imprint head 120 share one or more of all positioning components. In an alternative embodiment, the fluid dispenser 122 and the imprint head 120 move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon the topography profile of both the substrate 102 and the template 108. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy, for example, UV radiation, along an exposure path 128. The imprint head 120 and the substrate positioning state 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124. This is done for illustrative purpose so that the relative position of the individual components can be easily identified. An individual skilled in the art would understand that exposure path 128 would not substantially change when the template 108 is brought into contact with the formable material 124.

The nanoimprint lithography system 100 may further comprise a camera 136 positioned to view the spread of formable material 124 as the template 108 contacts the formable material 124 during the imprinting process. FIG. 1 illustrates an optical axis 138 of the field camera's imaging field as a dash line. As illustrated in FIG. 1, the nanoimprint lithography system 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the template 108 and in contact with the formable material 124 and regions underneath the template 108 but not in contact with the formable material 124. The camera 136 may be configured to provide images of the spread of formable material 124 underneath the template 108, and/or the separation of the template 108 from cured formable material 124. The camera 136 may also be configured to measure interference fringes, which change as the formable material 124 spreads between the gap between the surface 112 and the substrate surface.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate position stage 106, or both vary a distance between the template 118 and the substrate 102 to define a desired space (a bounded physical extent in three dimensions) that is filled with the formable material 124. For example, the imprint head 120 may apply a force to the template 108 such that it contacts the formable material 124.

Imprinting Process

Figure 2A:
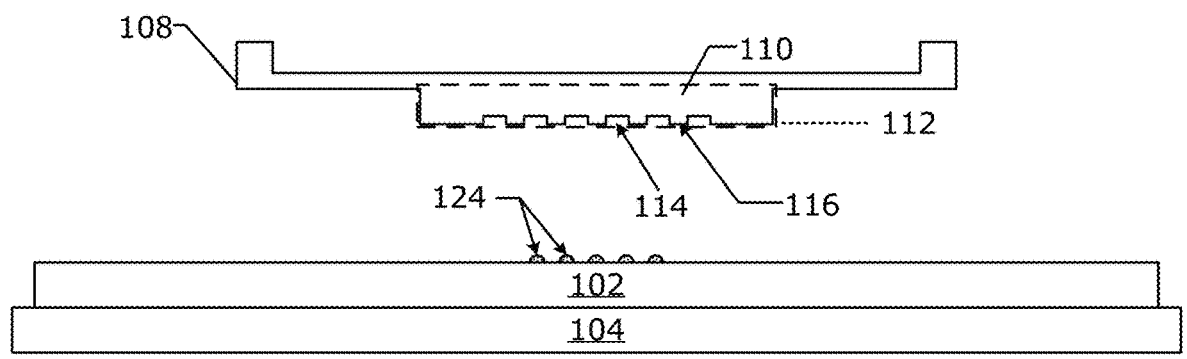
FIGS. 2A to 2C illustrate a nanoimprint lithography process.
Figure 2B:
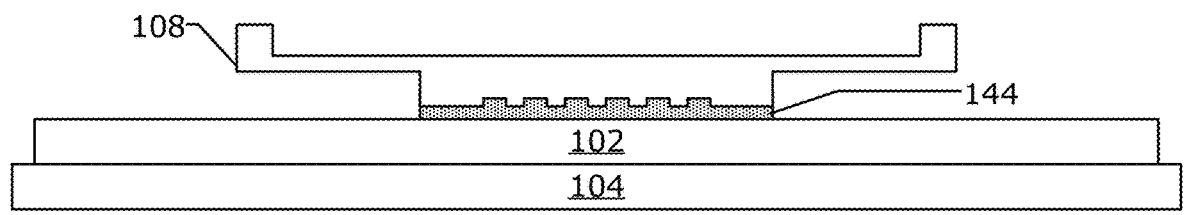
Figure 2C:
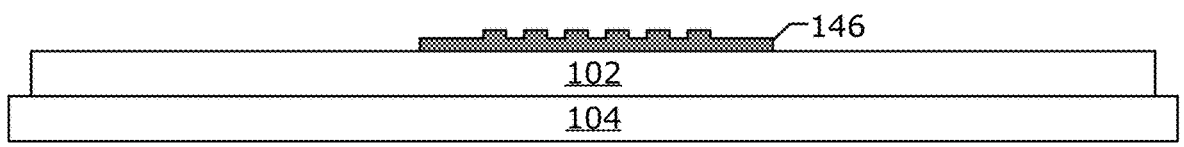

The imprinting process includes steps which are shown schematically in FIGS. 2A to FIG. 2C. As illustrated in FIG. 2A, the formable material 124 in the form of droplets is dispensed onto the substrate 102. As discussed previously, the substrate and template surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate and template topography. The template 108 is then positioned in contact with the formable material 124.

FIG. 2B illustrates a post-contact step after the template 108 has been brought into full contact with the formable material 124 but before a polymerization process starts. As the template 108 contacts the formable material 124, the droplets merge to form a formable material film 144 that fills the space between the template 108 and the substrate 102. Preferably, the filling process happens in a uniform manner without any air or gas bubbles being trapped between the template 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured patterned layer 146 on the substrate 102. Alternatively, curing of the formable material film 144 can also be initiated by using heat, pressure, chemical reaction, other types of radiation, or any combination of these. Once cured, patterned layer 146 is formed, the template 108 can be separated therefrom. FIG. 2C illustrates the cured patterned layer 146 on the substrate 102 after separation of the template 108.

Template Structure and Template Manufacturing Process

Figure 3A:
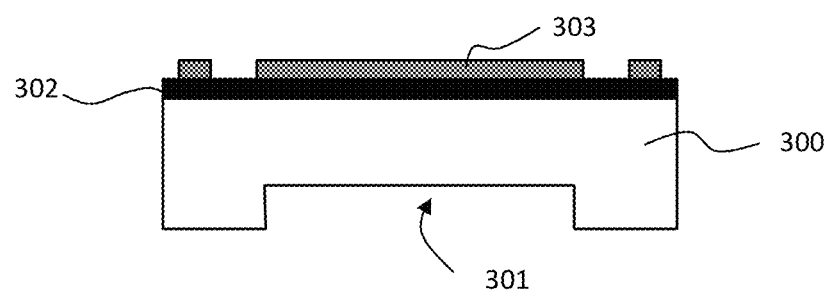
FIGS. 3A to 3H are cross-sectional diagrams showing a process of forming a template.

During the imprinting process, the template 108 is brought into full contact with formable material 124 applied on a substrate 102. More specifically, the formable material 124 is in full contact with a mold 110 formed on the template 108. The mold 110 may include a pattern to be transferred to the formable material 124. The mold 110 is often referred to as a mesa 110 formed on the contact side of the template 108. FIGS. 3A to 3G show the process of forming a template. As shown in FIG. 3A, a template plate 300 made of, for example, a glass plate made of glass-based material is provided. Preferably but optionally, the template plate 300 includes a core-out portion 301 recessed from a non-contact side of the template plate 300. A hard mask layer 302, for example, a Cr layer, is formed on the contact side of the template 300. A photoresist 303 is formed and patterned on the hard mask layer 302. The photoresist 303 may be formed by applying a photoresist layer on the hard mask layer 302 and patterning the photoresist layer using an a etch process. The patterned photoresist 303 includes a central portion and a peripheral portion.

Figure 3B:
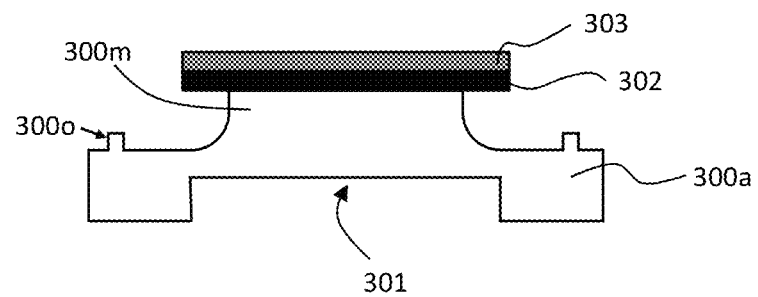
Figure 3C:
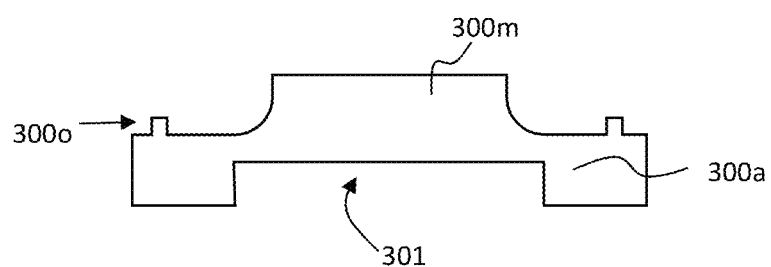
Figure 3D:
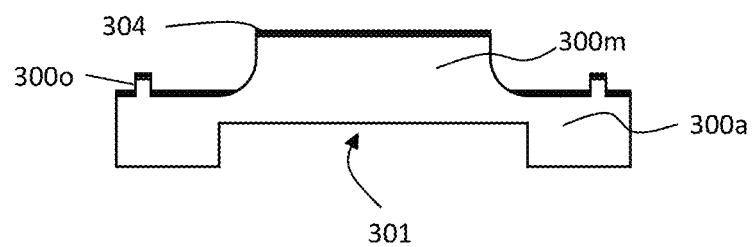
Figure 3E:
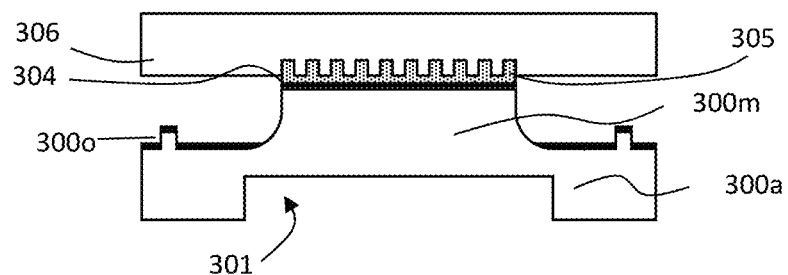
Figure 3F:
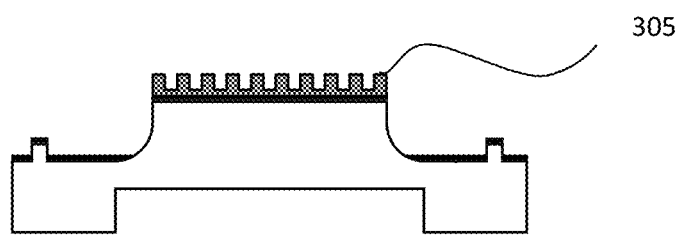
Figure 3G:
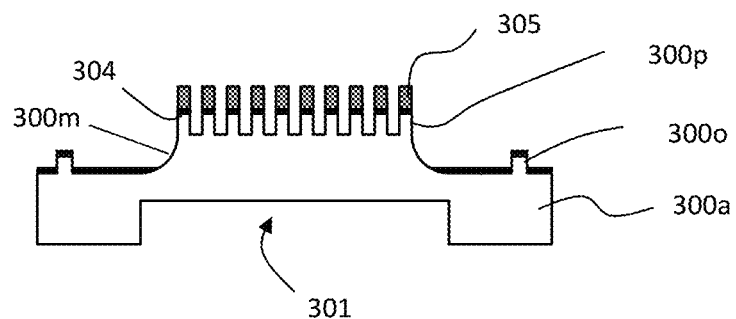
Figure 3H:
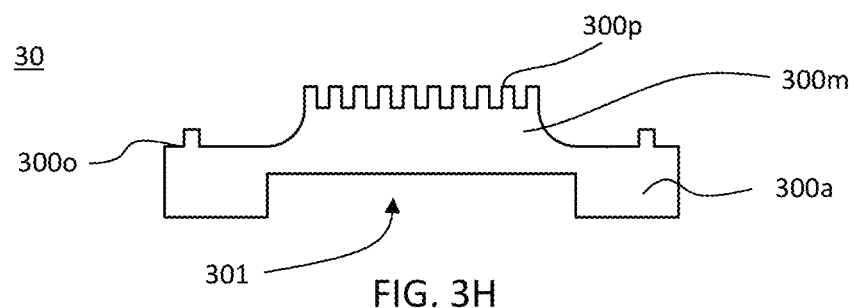

A wet etch process is performed on the template plate 300 to define the template plate 300 into a main portion 300a, and a mesa 300m protruding from a central portion of the main portion 300a, and an off-mesa mark 300o protruding from a peripheral portion of the main portion 300a. As shown in FIG. 3B, the residual hard mask 302 and the residual photoresist 303 after the wet etch process includes edge portions overhanging over the main portion 300a. The residual hard mask 302 and the residual photoresist 303 are then removed to expose the mesa 300m as shown in FIG. 3C. In FIG. 3D, another hard mask layer 304 is formed to cover the main portion 300a, the mesa 300m, and the off-mesa mark 300o. An imprint process is performed on the mesa 300m. For example, as shown in FIG. 3E, a formable material 305 is applied on the hard mask layer 304 on the mesa 300m. A master template 306 with a pattern is brought into contact with the formable layer 305 to transfer the pattern of the master template 306 to the formable material 305 as shown in FIG. 3E. For example, the radiation source 126 of FIG. 1 can provide actinic radiation that causes the formable layer 305 to cure, solidify, and/or cross-link, defining a cured patterned layer 305 on the template plate 300. Alternatively, curing of the formable layer 305 can also be initiated by using heat, pressure, chemical reaction, other types of radiation, or any combination of these as illustrated in FIG. 3E. The master template 306 is removed as shown in FIG. 3F. In FIG. 3G, a dry etch process is performed with the patterned formable material 305 as a mask to remove the exposed portions of the hard mask layer 304 and a portion of the mesa 300m under the exposed portion of the hard mask layer 304. In an embodiment, an etching process is used to transfer the pattern of the cured photoresist 305 to pattern the hard mask layer 304, and a dry etch process is used transfer the patterned hard mask layer into the mesa 300m of the template plate 300. The dry etch process results in the pattern 300p at a top portion of the mesa 300m. The residual formable material 305 and the residual hard mask layer 304 are then removed to form the template 30 with the pattern 300p at a top portion of the mesa 300m as shown in FIG. 3H.

As shown in FIGS. 3A to 3C, the mesa 300m is defined by a wet etching process with a photoresist 303 as a mask, while the pattern 300p is formed by a dry etch process as shown in an imprint lithography process as shown in FIGS. 3D to 3G. When the wet etch mask and the dry etch mask are created in separate processes there is inevitably some misalignment error. This misalignment error can be on the order of ±1.5 μm. This error occurs because features on the mesa defined using a dry etch process and the edge of the mesa is defined with a wet etch process. The dry etch process is used to etch at a depth on the order of 100 nm while the wet etch process is used for etching micron scale depths.

Figure 4A:
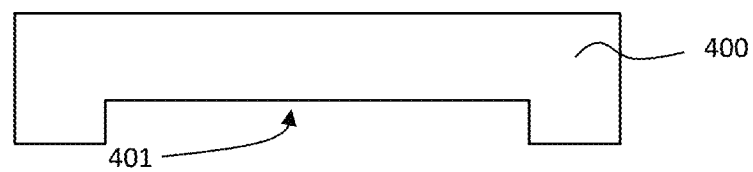
FIGS. 4A to 4J are cross-sectional diagrams showing a process of forming a template with a sub-micron precision.
Figure 4B:
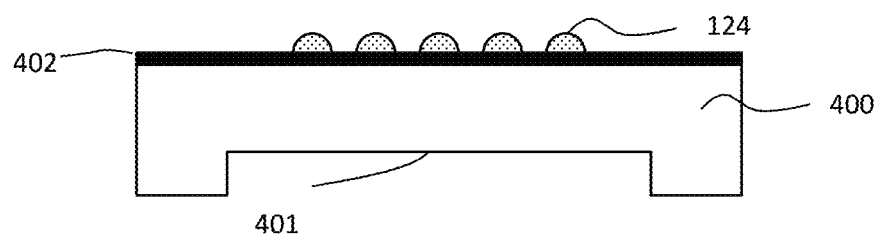

FIGS. 4A to 4I are cross-sectional views showing the process for forming a template without the alignment error cause by the process as shown in FIGS. 3A to 3H. In FIG. 4A, a template plate 400, for example, a plate made of glass based material (the glass-based material may be: fused silica; quartz; silicon; organic polymers; siloxane polymers; borosilicate glass; fluorocarbon polymers; metal; hardened sapphire; a 6025 photomask substrate; and/or the like that is transparent to actinic radiation), is provided. The template plate 400 may have a polygon, square, rectangular, or a circular disk shape with first side on which a mold is to be formed and a second side opposite to the first side. A core-out portion 401 recessed from the second side is formed at a central portion of the template plate 400. In one embodiment, the central core-out portion 401 has a diameter of about 64 mm. In FIG. 4B, a hard mask layer 402 is deposited on a template plate 400. The hard mask layer 402 may be formed of chromium (Cr). The hard mask layer 402 may have a thickness of about 5 to 30 nm. The hard mask layer 402 may be applied using standard coating techniques such as sputtering, evaporation, chemical vapor deposition, electroplating, electroforming, dip coating, spin coating, slot-die coating, inkjet printing, . . . , etc. Formable material 124 is then applied on the hard mask layer 402.

Figure 4C:
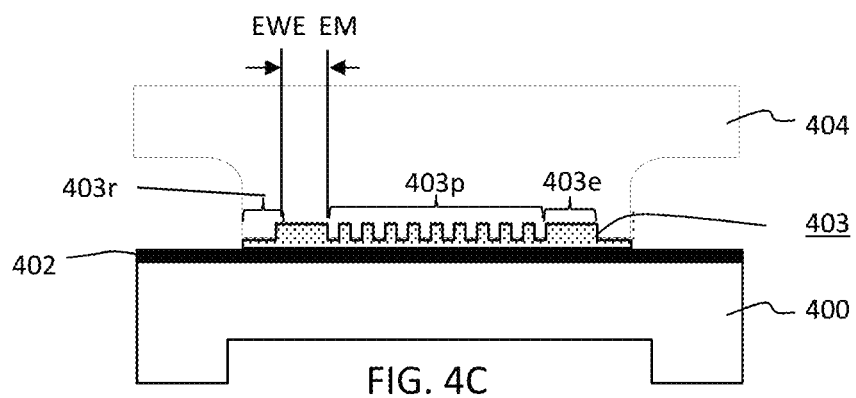
Figure 4D:
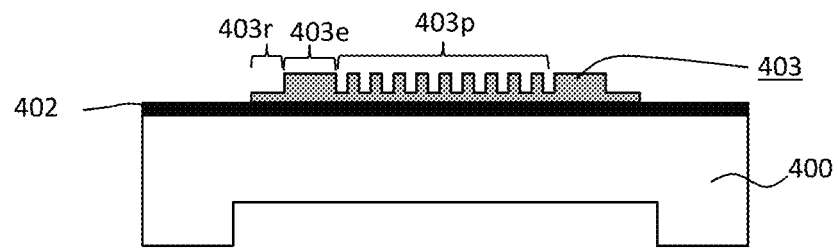
Figure 4E:
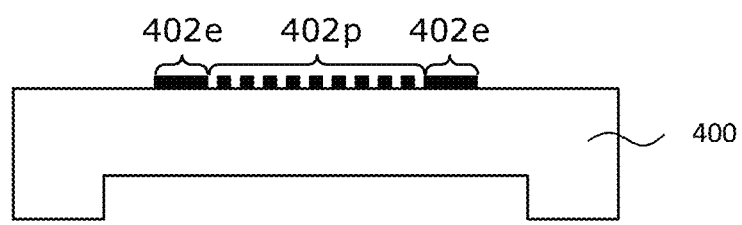

In FIG. 4C, an imprint lithography process is performed to form a photoresist or formable material mask 403. The imprint lithography process includes applying a formable material 124 onto the hard mask layer 402 as illustrated in FIG. 4B, bringing a master template 404 into full contact with the formable material 124 as illustrated in FIG. 4C, and transferring a pattern of the master template 404 to the formable material to form a dry-etch mask 403. The dry-etch mask 403 may be defined with a pattern portion 403p surrounded with an edge portion 403e, and a rim portion 403r surrounding the edge portion 403e. As shown in FIG. 4C, a master template 404 is used to define an edge of wet etch (EWE) and the pattern features 403p of the mask 403 in a single patterning step. The EWE is the outer edge of the edge portion 403e. The EWE will be used to define the edge of a mesa during a wet etch process, such that there is no alignment error between features and mesa edge EM. In the example as shown in FIG. 4C, the edge portion 403e, that is, the distance between the edge of wet etch (EWE) and the mesa edge (EM) is about 30 μm. The rim portion 403r is significantly thinner than the edge portion 403e. The master template 404 is removed from the dry-etch mask 403, and a dry etch process is performed to define the hard mask layer 402. In the embodiment as shown in FIG. 4C, the rim portion 403r is sufficiently thin that the portion of the hard mask layer 402 under the rim portion 403r is removed by the dry etch process or a descumming process which may be used prior to the dry etch process which is used to remove thin portions of the dry etch mask 403 prior to dry etching. As shown in FIG. 4E, the hard mask 402 is defined with a pattern 402p surrounded by an edge portion 402e.

Figure 4F:
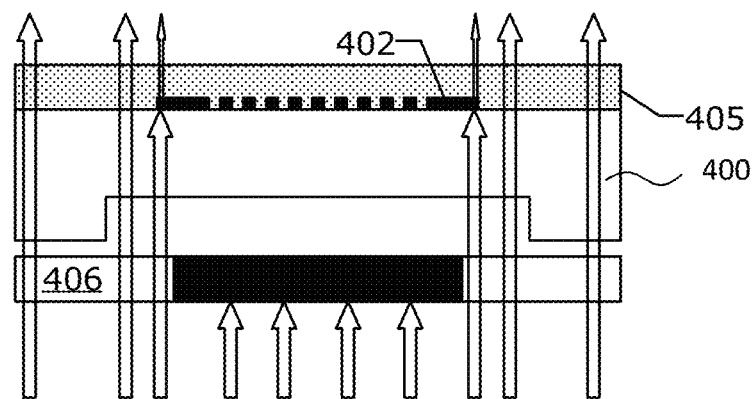
Figure 4G:
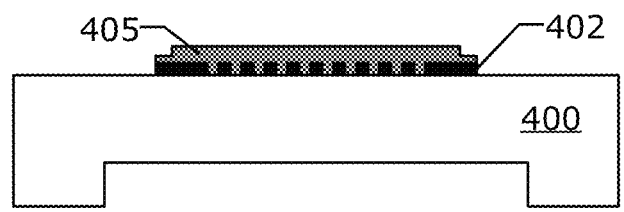

In FIG. 4F, a photoresist mask layer 405 is formed at the first side of the template plate 400 to cover the hard mask layer 402 and the exposed template plate 400. Light (the arrows as shown in the figure) is incident from the second side of the template plate 400. The template plate 400 is transparent to the light. Therefore, the light is incident on the photoresist layer 405 through the template plate 400. A photomask 406 is placed between the light source and the template plate 400. As shown in FIG. 4F, the photomask 406 blocks the light from being incident through the pattern portion 402p and may block some of the light incident on the edge portion 402e, while allowing light that travels outside the edge portion 402e. In an embodiment, the photomask 406 may allow some light to be incident on a portion of the edge portion 402e. The photoresist layer 405 is then developed to result in a photoresist mask 405 with a step-down rim as shown in FIG. 4G. In other embodiments, the photoresist mask 405 may also be formed without the step-down feature if light is completely blocked from being incident on the edge portion 402e. The photomask 406 is aligned with the patterned hard mask layer 402, such that the edge of the masking portion of the photomask 406 is between the outer edge of the edge portion EWE and an outer edge of the pattern EM. This reduces alignment requirement of the photomask 406 with the template plate 300, an edge of the blocking portion of the photomask 406 only needs to be within the distance between the EWE and the pattern portion 403p. The hard mask 402 is not etched away or substantially thinned while photoresist mask layer 405 is being developed. If the photomask 406 is perfectly aligned with the edge potion 402e and/or the edge portion 402 then there is no step-down rim.

Figure 4H:
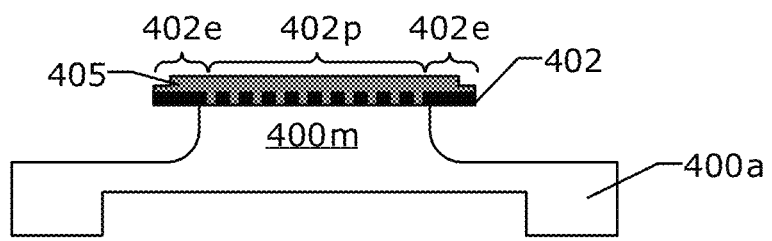
Figure 4I:
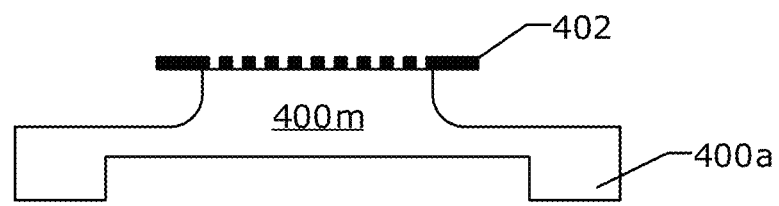
Figure 4J:
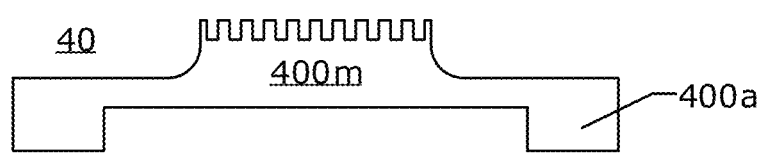

In FIG. 4H, a wet etch process is performed to remove the exposed portion of the template plate 400. In addition, the isotropic wet etch process also removes a portion of the template plate 400 under hard mask layer 402. As shown in FIG. 4H, the side wall of the mesa 400m has a curved shape with a narrow top and a wider bottom. In the embodiment as shown in FIG. 4H, the mesa 400m has a top surface with substantially the same size of the pattern portion 402p of the hard mask layer 402p, while the edge portion of the hard mask layer 402e and the photoresist mask 405 immediately above the edge portion 402e overhangs over the main portion 400a of the template plate 400. The photoresist mask 405 is then removed to expose the hard mask layer 402 as shown in FIG. 4H. In FIG. 4I, a dry etch process is performed with the hard mask layer 402 on the mesa 400m to pattern the mesa 400m. In FIG. 4J, the hard mask layer 402 is removed to form the template 40 that includes the mesa 400m, that is, the mold, with the pattern from the master template 404 used in FIG. 4C. The hard mask layer 402 and the photo resist mask 405 may be made of materials that are substantially etch resistant to the wet etch process that is used to form the mesa 400m relative to the isotropic wet etch rate of the template plate 400.

The template 40 manufactured by the process as shown in FIGS. 4A to 4J controls the positions of the mesa and the pattern in the same dry etch step in the imprint lithography. Therefore, both the mesa and the pattern are formed with a precision at the submicron, or even nano-scale. The alignment error occurs in the template 30 fabricated by the process as shown in FIG. 3A to 3G no longer exists.

Figure 5A:
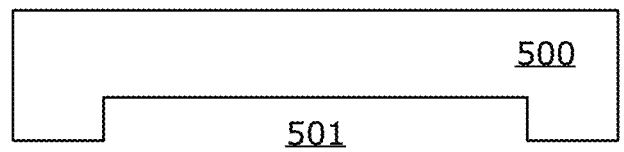
FIGS. 5A to 5M are cross-sectional diagrams showing a process of forming a template with a sub-micron precision.
Figure 5B:
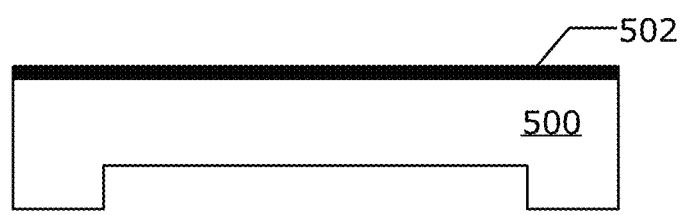
Figure 5C:
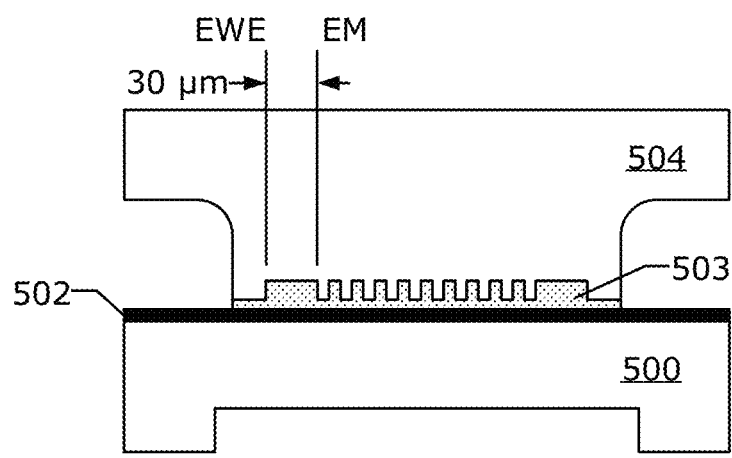
Figure 5D:
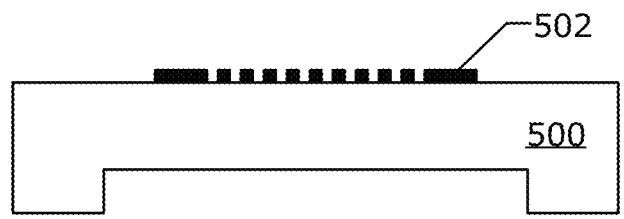
Figure 5E:
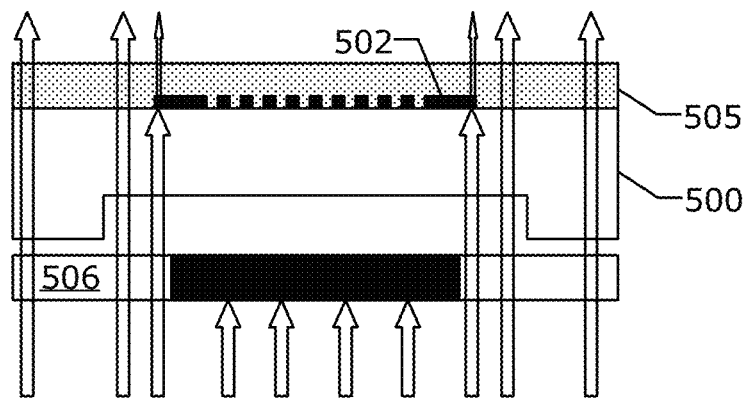
Figure 5F:
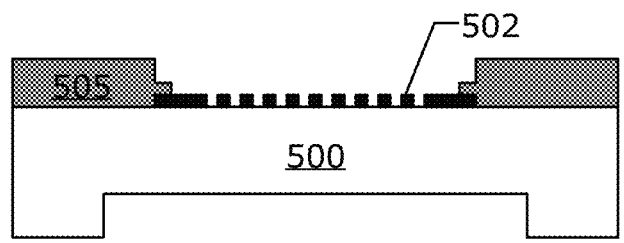
Figure 5G:
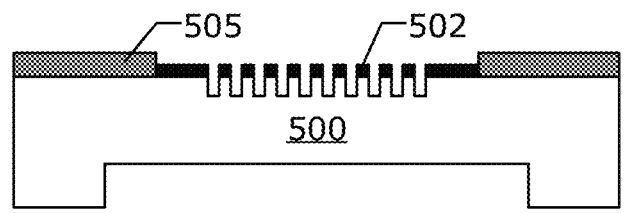

FIGS. 5A to 5M are cross sectional views showing the process of manufacturing a template according to another embodiment. The steps as shown in FIGS. 5A to 5D are the same as those as shown in FIG. 4A to 4D. The step in FIG. 5E is similar to that as shown in FIG. 4E except that the photoresist layer 505 is selective from the negative tone photoresist material. That is, once being exposed to light, the portion being exposed to the light remains after development, while the unexposed portion of the photoresist layer 505 is removed by development. As shown in FIG. 5F, the portion of the photoresist layer 505 exposed to the light remains on the template plate 500. The remaining photoresist layer 505 may have a step-like configuration with a thinner inner rim covering a portion of the edge portion of the hard mask layer 505 and a thicker portion immediately adjacent to the template plate 500. As shown in FIG. 5G, a dry etch process is performed to transfer the pattern of the hard mask layer 502 to the top portion of the template plate 500. In an embodiment, prior to using the dry etch process, the thinner inner rim of the photoresist layer may be removed in a descumming process that removes thin layers of photoresist while leaving the thick layers of photoresist intact.

Figure 5H:
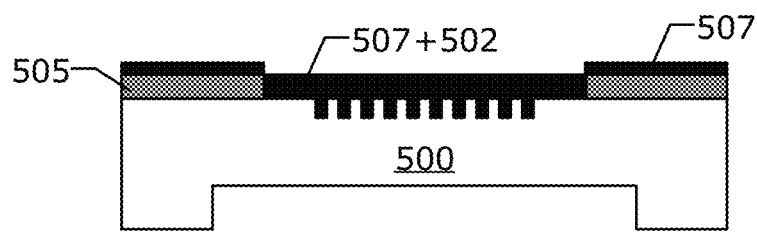
Figure 5I:
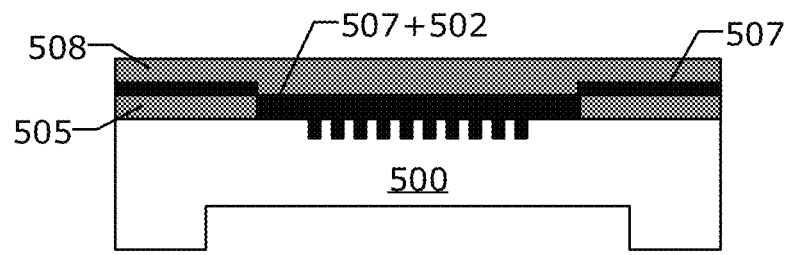
Figure 5J:
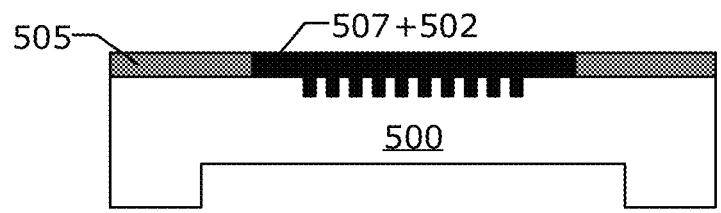
Figure 5K:
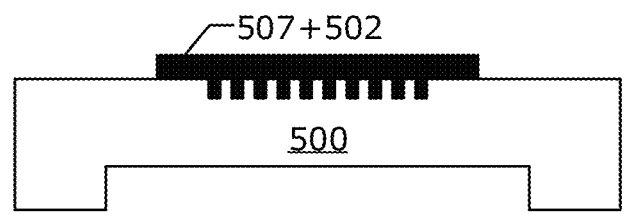
Figure 5L:
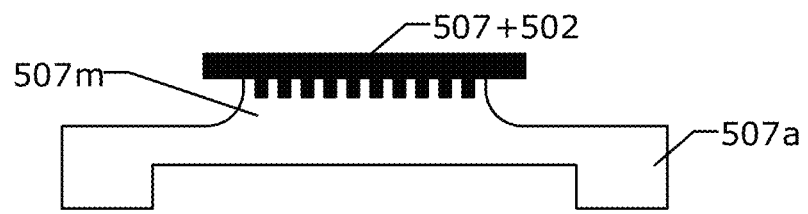
Figure 5M:
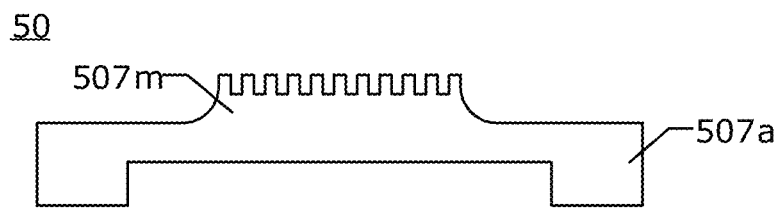

In FIG. 5H, another hard mask layer 507 is formed to cover the photoresist layer 505, the exposed hard mask layer 502, and the exposed template plate 500. Another photoresist layer 508 is formed and planarized on the hard mask layer 507 as shown in FIG. 5I. An etch process is then performed to remove the photoresist layer 508 and the portion of the hard mask layer 507 covering the photoresist layer 506 to result in the feature as shown in FIG. 5J. In FIG. 5K, the photoresist layer 506 is removed. A wet etch process is performed to form the mesa 500m as shown in FIG. 5L. The hard mask layers 502 and 507 are then removed, and a template 50 with the mesa 500m with a pattern is formed as shown in FIG. 5M. The process as shown in FIGS. 5A to 5M define the edge portion and the pattern of the mesa in the same dry etch process in the imprint lithography as shown in FIG. 5C. As a result, a precision of both the pattern and the edge of wet etch at the submicron or nano-scale can be achieved. In the current embodiment, an additional hard mask layer 507 is formed. The increased thickness prevents the pattern one the mesa from being etched, damaged, or removed in the wet etch process, particularly when the wet process is performed with a faster speed.

Figure 6A:
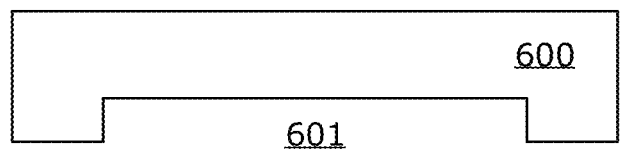
FIGS. 6A to 6R are cross-sectional diagrams showing a process of forming a template with a sub-micron precision.
Figure 6B:
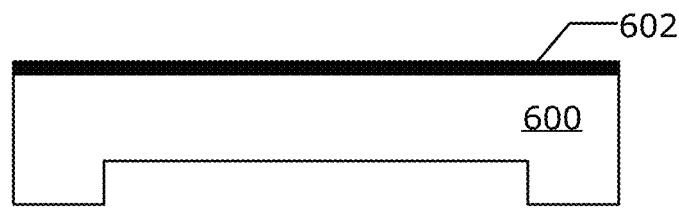
Figure 6C:
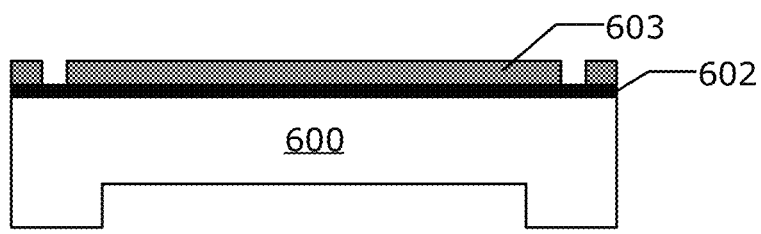
Figure 6D:
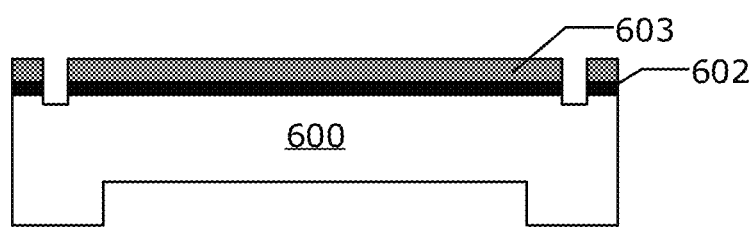
Figure 6E:
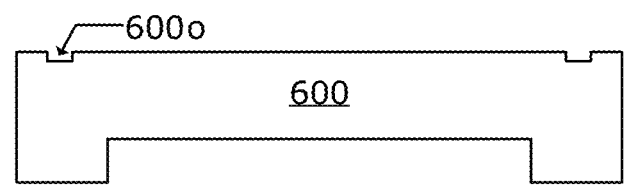
Figure 6F:
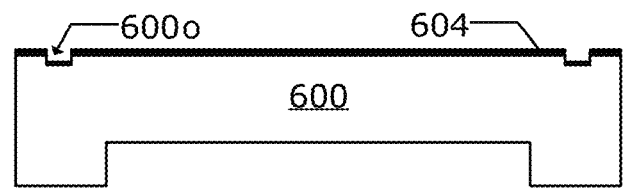
Figure 6G:
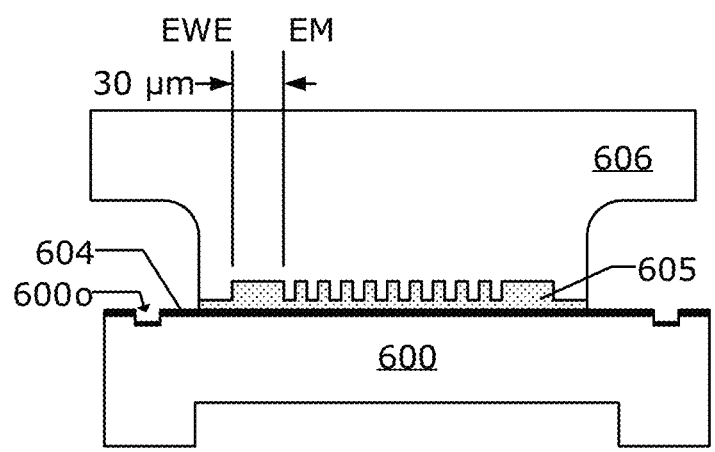
Figure 6H:
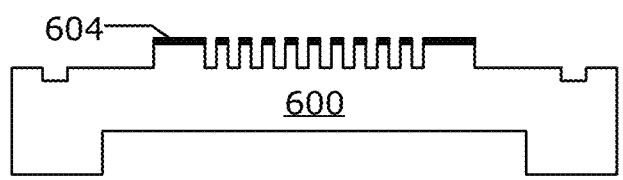
Figure 6I:
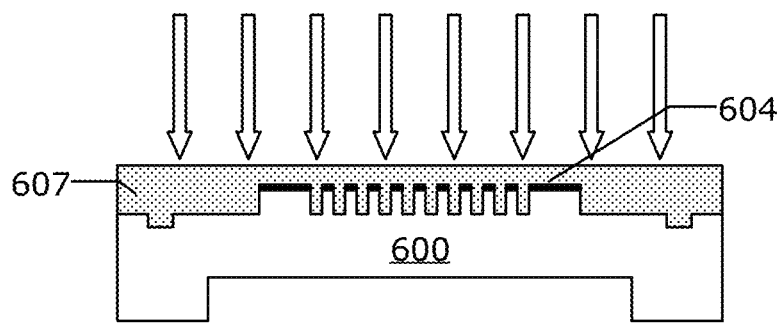
Figure 6J:
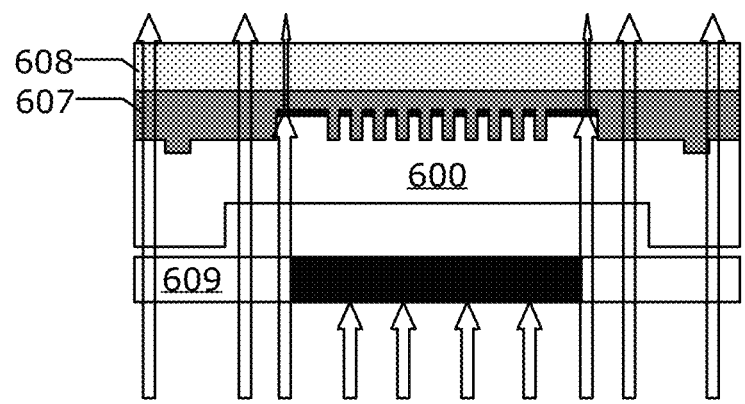
Figure 6K:
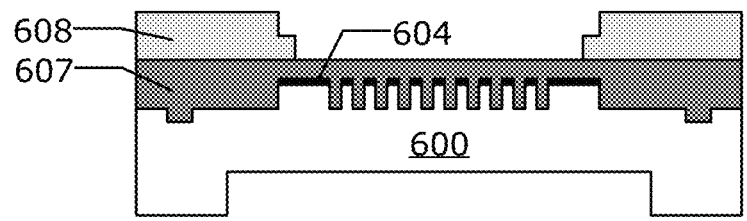
Figure 6L:
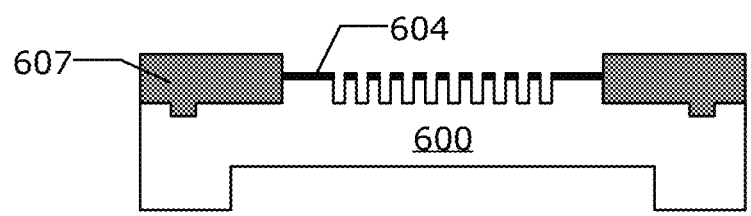
Figure 6M:
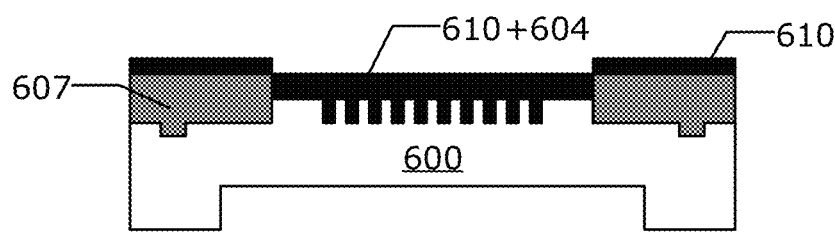
Figure 6N:
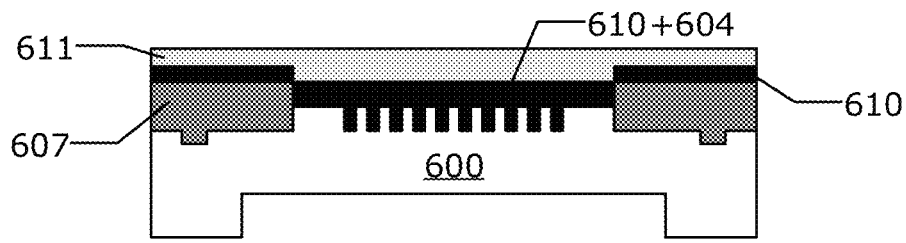
Figure 6O:
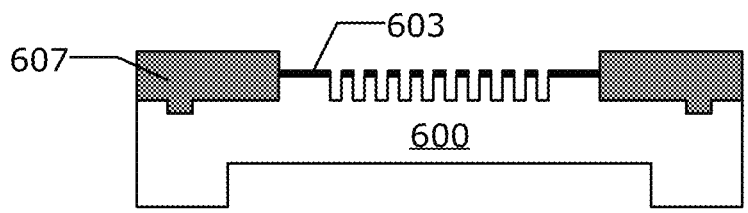
Figure 6P:
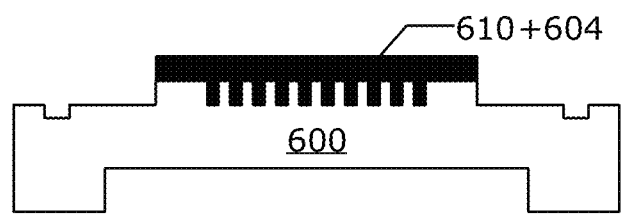
Figure 6Q:
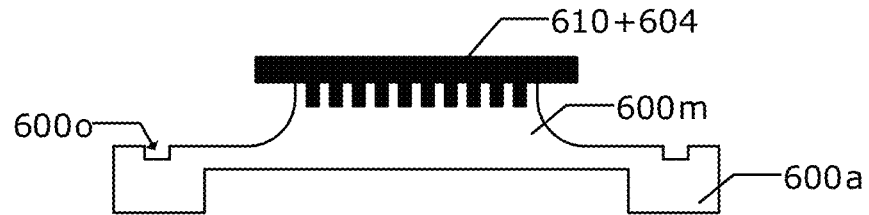
Figure 6R:
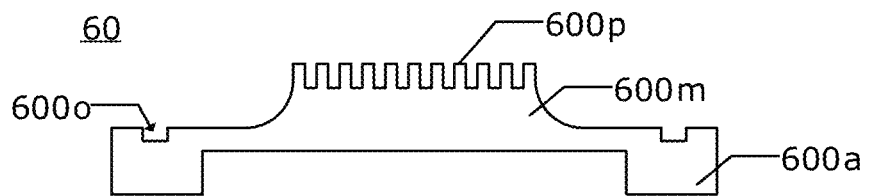

FIGS. 6A to 6R shows another exemplary process for forming a template. In FIG. 6A, template plate 600 is provided. The template plate 600 may be made of glass-based material and is transparent to the light used for imprint and lithography process. For example, the template plate is transparent to at least ultra-violet (UV) light. The template plates 300, 400, and 500 discussed previously are also transparent to the light used for imprint lithography process. The template plate 600 includes a first side on which a mesa, that is, a mold with a pattern is to be formed, and a second side opposite to the first side. As shown in FIG. 6A, a core-out portion 601 may be formed to be recessed from the surface of the second side. In FIG. 6B, a hard mask layer 602 is formed to cover the first side of the template plate 600. The hard mask layer 602 may be formed of Cr, for example. In FIG. 6C, a photoresist mask 603 is formed and patterned on the hard mask layer 602. The photoresist mask 603 includes an opening exposing the hard mask layer 602 near the edge of the template plate 600, so as to define an off-mesa alignment mark. An etching process is performed to remove the exposed portion of the hard mask layer 602 and a portion of the template plate 600 covered by the exposed portion of the hard mask layer 602. As shown in FIG. 6D, a trench recessed from the surface of the first side is formed near the edge of the template plate 600. In FIG. 6E, the photoresist mask 603 and the hard mask layer 602 are removed to result in the off-mesa alignment mark 600o recessed from the surface of the second side of the template plate 600.

In FIG. 6F, another hard mask layer 604 is formed on the template plate 600 which includes the off-mesa alignment mark 600o. In FIG. 6G, an imprint lithography process is performed to form an imprint mask 605 which includes a pattern transferred from a master template 606 and a wet-etch edge surrounding the pattern. The imprint mask 605 may be aligned using the off-mesa alignment mark 600*o*. The master template 606 is removed, and a dry etch process is performed to remove the portion of hard mask layer 604 that is uncovered by the imprint mask 605 and the portion of template plate 600 under the exposed hard mask layer 604. As a result, the portion of the template plate 600 covered by the photoresist layer 605 during the dry etch process protrudes from the surrounding portion of the template plate 600 as shown in FIG. 6H.

In FIG. 6I, a photoresist layer 607 is formed to cover the exposed template plate 600 and the remaining hard mask layer 604. The photoresist layer 607 is planarized. Light indicated by the arrows is incident on the photoresist layer 607 from the first side of the template plate 600. Another photoresist layer 608 is formed on the planarized photoresist layer 607. Light is incident on the photoresist layers 607 and 608 from a second side of the template plate 600 with a photomask 609 placed between the template plate 600 and the light source as shown in FIG. 6J. The photomask 609 includes a shading portion aligned with the protruding portion of the template plate 600, while leaving the photoresist layers 607 and 608 at the edge of the protruding portion of the template plate 600 exposed to the light. The exposed portion of the photoresist layers 607 and 608 are developed. The photoresist layers 607 will not be removed as it has been previously exposed to light. The development process removes a central portion of the photoresist layer 608, but does not remove any substantial portion of the photoresist layer 607. As shown in FIG. 6K, after the development process, the photoresist layer 608 has an opening and may have a step-like inner edge. The opening exposing the portion of the photoresist layer 607 covering the main portion of the hard mask layer 604 and the patterned feature of the template plate, while the step-like inner edge of the photoresist layer 608 covers an edge of the hard mask layer 604.

An etching process is performed to remove the remaining photoresist layer 608, the exposed portion of the photoresist layer 607, and the portion of the photoresist layer 607 covered by the inner edge of the photoresist layer 608 to result in the feature as shown FIG. 6L. In FIG. 6L, the hard mask layer 604 and the patterned features of the template plate 600 are exposed, while the template portion 600 surrounding the pattern features is still covered by the remaining photoresist layer 607. In FIG. 6M, an additional hard mask layer 610 is formed to cover the photoresist layer 607 and the exposed hard mask layer 604 and the pattern features of the template plate 600. As a result, the fine pattern features is covered with an increased thickness of the hard mask materials to further protect the fine pattern features from being damaged during the subsequent processes.

In FIG. 6N, another photoresist layer 611 is formed and planarized on the hard mask layer 610. An etching process is performed to remove a part of the hard mask layer 610 until the photoresist layer 607 is exposed as shown in FIG. 6O. The photoresist layer 607 is removed, and the portion of the template plate 600 surrounding the pattern features is exposed as shown in FIG. 6P. A wet etch process is performed to form the mesa 600*m*. As shown in FIG. 6Q, the edge of the hard mask layer 610 and 604 overhangs over and above the portion 600*a* of the template plate 600. The hard mask layers 610 and 604 are then removed to form the template 60 which includes a flat portion 600*a*, a mesa 600*m* with the desire pattern 600*p*, and an off-mesa alignment mark 600*o* recessed from the surface of the flat portion 600*a* as shown in FIG. 6R.

Figure 7:
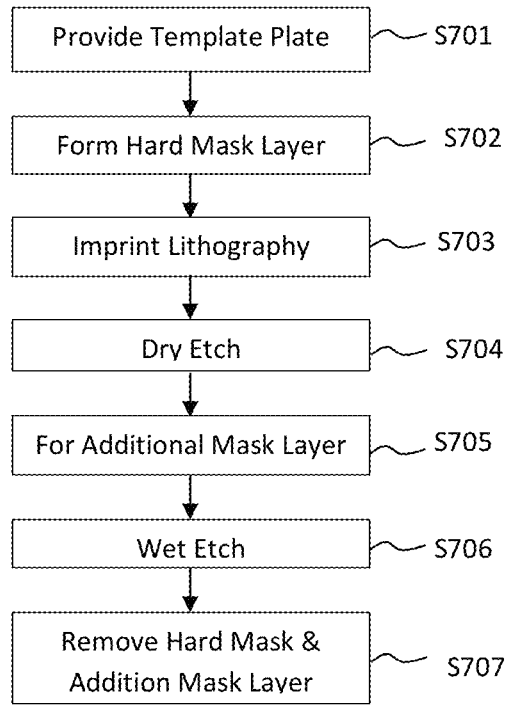
FIG. 7 shows the method of forming a template according to one of the embodiments.

FIG. 7 shows a method of forming the template through the processes illustrated in FIGS. 4A to 4I, FIGS. 5A to 5M, or FIGS. 6A to 6R. In step S701, a template plate is provided. The template has a first side and a second side opposite to the second side. A hard mask layer is formed on at the first side of the template plate in step S702. In step S703, an imprint lithography process is performed on the hard mask layer to form a hard mask covering a predetermined region of the template plate. The hard mask includes a pattern portion and an edge portion surrounding the pattern portion defined in the same imprint lithography process. A dry etch process is performed with the first region covered with the patterned hard mask in step S704. An additional mask layer is formed on the patterned hard mask in step S705. A wet etch process is performed on the template plate with both the patterned hard mask and the additional mask layer formed thereon to form a mesa under the pattern portion with the edge portion of the hard mask overhanging on the second region of the template plate in step S706. The patterned hard mask and the additional mask layer are then removed to form a template with a mesa that includes pattern features formed thereon in step S707. In the method as shown in FIG. 7, the pattern features and the edge portion of the mesa are defined in the same imprint lithography process with a submicron or nanoscale precision. Therefore, the alignment error occurs for the process that defines the edge portion with wet etch no longer exists.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of forming an imprint template, comprising:
   providing a template plate having a first side and a second side opposite to the first side, the first side having a first region and a second region surrounding the first region;
   forming a hard mask layer on the first side of the template plate;
   performing imprint lithography on the hard mask layer to form a first mask used to form a patterned hard mask covering the first region of the template plate, the patterned hard mask having a pattern portion and an edge portion defined in the same imprint lithography;
   dry etching the template plate with the first region of the template plate covered with the patterned hard mask;
   forming a negative photoresist layer to cover the first side of the template plate;
   exposing the photoresist layer formed over the first region with light incident from the second side while shielding the photoresist layer formed over the second region from being exposed by the light; and
   developing the negative photoresist layer to form a photoresist mask having an outer portion covering the second region of the template plate and an inner portion covering a periphery of the edge portion of the patterned hard mask;
   forming an additional hard mask layer on the patterned hard mask and the remaining photoresist mask; and forming an additional photoresist layer on the additional hard mask layer;

planarizing the additional photoresist layer until the additional hard mask covering the remaining photoresist mask is removed and the additional mask is formed;

wet etching the template plate with both the patterned hard mask and the additional mask layer formed thereon to form a mesa under the pattern portion with the edge portion of the hard mask overhanging on the second region of the template plate; and removing the patterned hard mask and the additional hard mask layer after wet etching the template plate to form the mesa under the pattern portion with the edge portion overhanging on second region of the template plate.

2. The method of claim 1, wherein the template plate includes a glass plate.

3. The method of claim 1, wherein the hard mask layer includes a Cr layer.

4. The method of claim 1, further comprising forming a core-out portion at the second side, the core-out portion being aligned with the first region.

5. The method of claim 1, wherein performing imprint lithography further comprises:
applying an imprint resist layer on the hard mask layer over the first region of the template plate;
contacting a master template with the imprint resist layer to transfer a pattern to the imprint resist layer;
curing the imprint resist layer; and
removing the master template from the cured imprint resist layer.

6. The method of claim 5, further comprising removing the additional mask layer after wet etching the template plate and prior to dry etching the template plate.

7. The method of claim 1, prior to dry etching the template plate, further comprising:
forming a positive photoresist layer to cover the first side of the template plate;
exposing the photoresist layer formed over the first region with light incident from the second side while shielding the photoresist layer formed over the second region from being exposed by the light; and
developing the positive photoresist layer to form the additional mask covering the patterned hard mask, the additional mask including a central portion and a periphery thinner than the central portion.

8. The method of claim 1, further comprising forming a marking in the second region of the template plate before forming the patterned hard mask.

9. The method of claim 1, wherein the edge portion of the patterned hard mask has a width of about 30 µm.

10. The method of claim 1, wherein an edge of the mesa formed by wet etching is defined by an edge feature in the patterned hard mask that is formed with an imprint lithography template that is also used to define pattern features using dry etching in the first region of the template.

11. The method of claim 1, further comprising forming a core-out portion at the second side, the core-out portion being aligned with the first region, prior to performing imprint lithography on top of the hard mask.

12. A method of forming an imprint template, comprising:
providing a template plate having a first side and a second side opposite to the first side, the first side having a first region and a second region surrounding the first region;
forming a hard mask layer on the first side of the template plate;
performing imprint lithography on the hard mask layer to form a first mask used to form a patterned hard mask covering the first region of the template plate, the patterned hard mask having a pattern portion and an edge portion defined in the same imprint lithography;
dry etching the template plate with the first region of the template plate covered with the patterned hard mask:
forming a marking in the second region of the template plate before forming the patterned hard mask;
forming a first photoresist layer after dry etching the template plate with the patterned hard mask formed on the template plate;
exposing the photoresist layer with light from the first side of the template plate;
forming a second photoresist layer on the first photoresist layer;
exposing the first photoresist layer and the second photoresist layer with light incident from the second side of the template plate;
developing the second photoresist layer to form a photoresist mask, the photoresist mask includes a thicker outer portion covering a part of the first photoresist layer on the second region of the template plate and a thinner portion covering a part of the first photoresist layer on a periphery of the edge portion of the patterned hard mask;
removing the developed second photoresist layer;
forming an another hard mask layer on the patterned hard mask;
forming a third photoresist layer;
planarizing the third photoresist layer until the another hard mask layer over the second region of the template plate is removed;
removing the first photoresist layer;
wet etching the template plate with both the patterned hard mask and the another mask layer formed thereon to form a mesa under the pattern portion with the edge portion of the patterned mask overhanging on the second region of the template plate; and
removing the patterned hard mask and the another hard mask after wet etching the template plate to form the mesa under the pattern portion with the edge portion overhanging on second region of the template plate.

* * * * *